(12) United States Patent
Liu

(10) Patent No.: US 7,272,000 B2
(45) Date of Patent: Sep. 18, 2007

(54) HEAT DISSIPATING STRUCTURE OF INTERFACE CARD

(75) Inventor: Spring Liu, Taipei (TW)

(73) Assignee: Inventec Corporation (TW)

( * ) Notice: Subject to any disclaimer, the term of this patent is extended or adjusted under 35 U.S.C. 154(b) by 246 days.

(21) Appl. No.: 11/096,948

(22) Filed: Mar. 31, 2005

(65) Prior Publication Data

US 2006/0221569 A1 Oct. 5, 2006

(51) Int. Cl.
*H05K 7/20* (2006.01)

(52) U.S. Cl. .................. 361/687; 165/83; 165/80.3; 361/695

(58) Field of Classification Search ........... 361/687, 361/695–698; 165/80.3, 83
See application file for complete search history.

(56) References Cited

U.S. PATENT DOCUMENTS

| 5,959,836 A * | 9/1999 | Bhatia ................. 361/687 |
| 6,717,811 B2 * | 4/2004 | Lo et al. .............. 361/698 |
| 6,775,135 B2 * | 8/2004 | Lo ...................... 361/687 |
| 6,937,474 B2 * | 8/2005 | Lee ..................... 361/715 |
| 2005/0068727 A1 * | 3/2005 | Yu ...................... 361/689 |
| 2006/0196639 A1 * | 9/2006 | Yang et al. ............. 165/83 |

* cited by examiner

*Primary Examiner*—Michael C. Zarroli
(74) *Attorney, Agent, or Firm*—Peter F. Corless; Steven M. Jensen; Edwards Angell Palmer & Dodge LLP

(57) ABSTRACT

A heat dissipating structure of an interface card is applied in an electronic device. The structure includes a heat dissipating apparatus attached to a circuit board of the electronic device, wherein the heat dissipating apparatus comprises a heat sink and a fan received in a room of the heat sink; and an interface card electrically connected to the circuit board of the electronic device via a connector. At least a surface of the interface card that is mounted with semiconductor components is mounted on top of a part of the heat dissipating apparatus in a faced-down manner to dissipate heat generated during operations of the semiconductor components to an external environment through the heat sink and the fan.

11 Claims, 2 Drawing Sheets

HEAT DISSIPATING STRUCTURE OF INTERFACE CARD

FIELD OF THE INVENTION

The present invention relates to a heat dissipating structure, and more particularly, to a heat dissipating structure applied in an electronic device.

BACKGROUND OF THE INVENTION

In the quickly changing, highly competitive world of electronics industry, electronic devices have been developed rapidly with more and more functions, resulting in increased power demand. As a result, a single system often has more than one heat-generating components. In the prevailing trend of electronic device minimization, heat dissipation for heat-generating components in a confined space becomes a problem waiting to be solved.

For instance, a laptop or a personal computer may comprise a CPU (central processing unit) and other electronic components such as a video card and the like. It is common to have two or many heat-generating components in a computer or in a workstation; however, if the heat cannot be dissipated, it may burn the internal circuit in a chip and eventually lead to a destructive breakdown of the whole electronic system. Therefore, it is desirable to set a product goal in dissipating as much heat as possible in the smallest space, so that the heat-generating components can be operated smoothly and reliably under an adequate environment.

For example, a typical interface card (such as a video card) in a laptop comprises many semiconductor chips including active components and/or passive components such as a capacitor, a resistor, and an inductor. In order to effectively dissipate the heat generated during operation of the semiconductor chips in the interface card, the semiconductor chips are usually connected to a surface of the interface card through electrical terminals such as pins, and then a thermal conductive gel is applied on an inactive surface of the semiconductor chip for attaching a heat dissipating unit such as a fin thereto so as to dissipate the heat generated by the chip during its operation. Furthermore, typically a fan is further employed to dissipate the heat generated by various electronic components during their operation for improving the overall heat dissipating efficiency of the electronic components formed in the laptop.

The ever-growing demand of an slim and minimized electronic device leads to a trend of developing a thinner and lighter laptop; however, if a fin with a certain thickness is provided for the semiconductor chip of the interface card, the overall thickness of the system would increase and therefore would not satisfy the tendency of lighter and thinner laptop. Moreover, if the interface cards provided in a laptop include a video card, a sound card and a peripheral interface card, attaching fins to the semiconductor chips of each interface card respectively may result in an increase in production cost.

Thereby, under the consideration of minimization of the electronic devices within a confined space, the problem that urgently needs to be solved is how to effectively provide heat dissipation for an interface card in an electronic device.

SUMMARY OF THE INVENTION

In light of the above prior-art drawbacks, a primary objective of the present invention is to provide a heat dissipating structure that can effectively improve the heat dissipation efficiency of an interface card in a slim and minimized electronic device with limited space.

Another objective of the present invention is to provide a heat dissipating structure to effectively remove the heat from an interface card, and to reduce the amount of heat dissipating apparatus attaching thereto, so as to save spaces and the cost of production.

In accordance with the foregoing and other objectives, the present invention provides a heat dissipating structure that can be applied in an electronic device.

The heat dissipating structure comprises a heat dissipating apparatus attached to a circuit board of an electronic device comprising a heat sink and a fan, wherein the heat sink provides a room for placing the fan; and an interface card electrically connected to the circuit board of the electronic device via a connector, wherein at least one surface of the interface card mounted with semiconductor components is mounted on top of the heat dissipating apparatus in an upside-down manner to remove the heat generated during operations of the semiconductor components to an external environment through the heat sink and the fan.

The key features of the heat dissipating structure in the present invention are that the heat sink of the heat dissipating apparatus is made of metal material with better thermal conductivity; the heat sink is formed with an airfoil extending beneath the interface card without interfering the circuit layout of the electronic device; and the surface with the semiconductor component mounted thereon is arranged faced-down on top of the airfoil of the heat sink, wherein the semiconductor components are preferably in contact with the airfoil of the heat sink, so as to immediately dissipate the heat generated during operations of the semiconductor components through the heat sink and the fan received therein into the ambient air without the need to further provide heat dissipating units (e.g. a fin) on the semiconductor components. Thereby, under the consideration of minimization of the electronic devices within a confined space, the heat generated by the semiconductor components mounted on the interface card can be effectively dissipated, and less space and fabrication cost can also be accomplished.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a heating dissipating structure proposed in the present invention are described in detail as follows with reference to FIG. 1 and FIG. 2.

Figure 1:
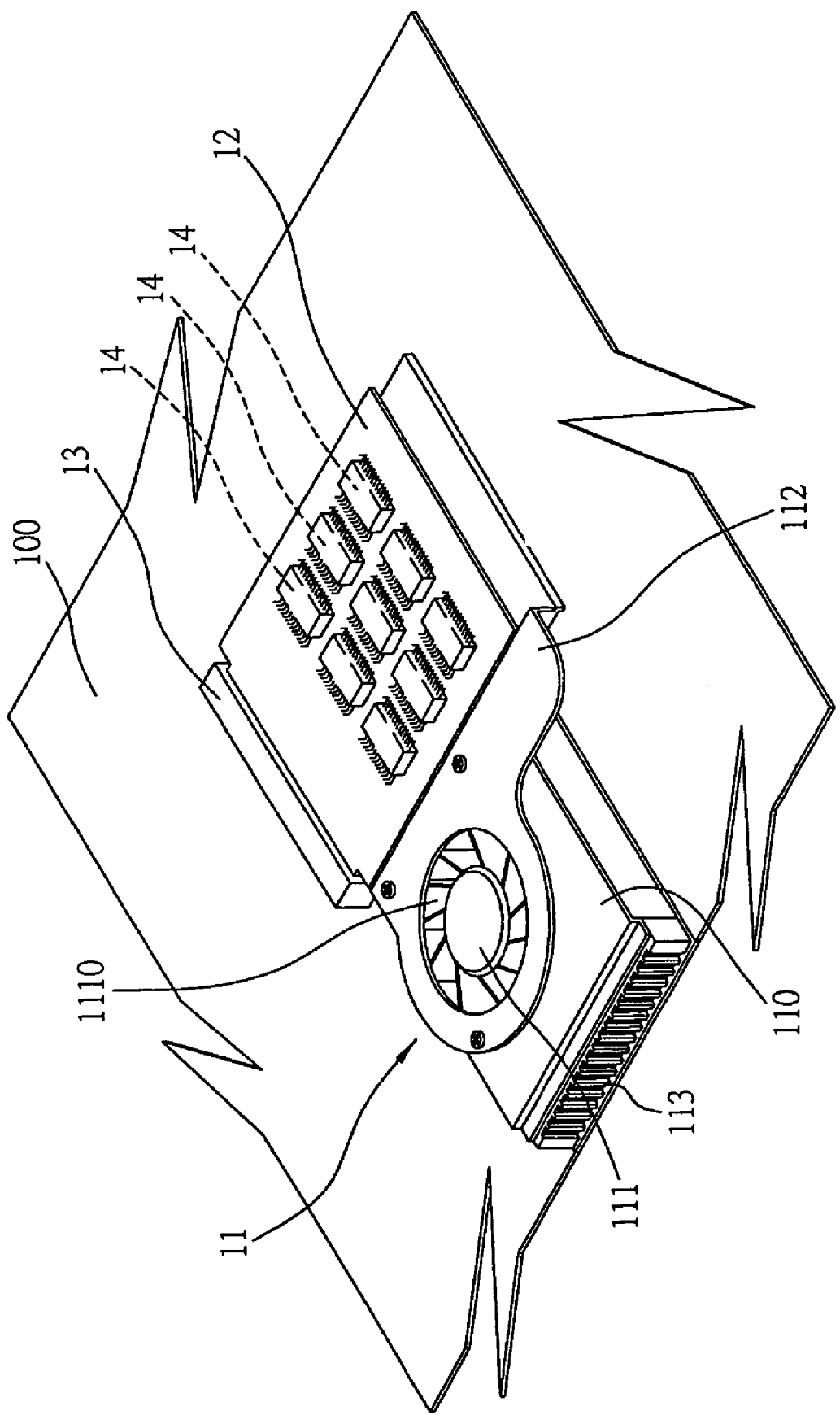
FIG. 1 is a perspective view of a heat dissipating structure for an interface card according to a first preferred embodiment of the present invention.

FIG. 1 is a perspective view of a heat dissipating structure for an interface card fabricated according to a first preferred embodiment of the present invention. The heat dissipating structure comprises a heating dissipating apparatus 11, and an interface card 12 and can be applied in an electronic device such as a laptop and the like.

The heat dissipating apparatus 11, mounting on a location of a circuit board 100 of an electronic device that leaves the layout of electronic components unaffected, comprises a heat sink 110 and a fan 111, wherein the heat sink 110 provides a room for storing the fan 111.

The fan 111 comprises a plurality of blades 1110 for creating convection airflow by power driven spinning, so as to enhance heat dissipation.

The heat sink 110 is a bulk structure comprising a room for storing the fan 111 formed therein and an airfoil 112 extended outwardly from the bulk structure to beneath the interface card 12 without affecting the attaching site of electronic components. In order to effectively dissipate the heat generated by the internal electronic components, the heat sink 110 comprises an air outlet 113 connected to the room for receiving the fan, so as to expel the convective airflow generated by the operating fan 111 from the air outlet. For the heat dissipating apparatus 11 to provide a better dissipation effect and an easier pressing process, in this embodiment, the heat sink 110 is made of an aluminum alloy material that has outstanding thermal conductivity and malleability.

The interface card 12, such as a video card in a laptop, is mainly attached and electrically connected to the circuit board 100 of the electronic device via a connector 13, wherein at least a surface thereof is attached with one or more semiconductor components 14 such as an active component of a semiconductor chip, or a passive component such as a resistor, a capacitor or an inductor. The surface of the interface card 12 attached with the electronic components 14 is mounted on top of the heat dissipating apparatus 11 in a faced-down manner. The semiconductor component 14 is preferably in contact with the extending airfoil 112 of the heat sink 110 to dissipate the heat generated by the semiconductor component during the operation to an external environment through the extending airfoil 112, of the heat sink 110 and the fan 111.

Figure 2:
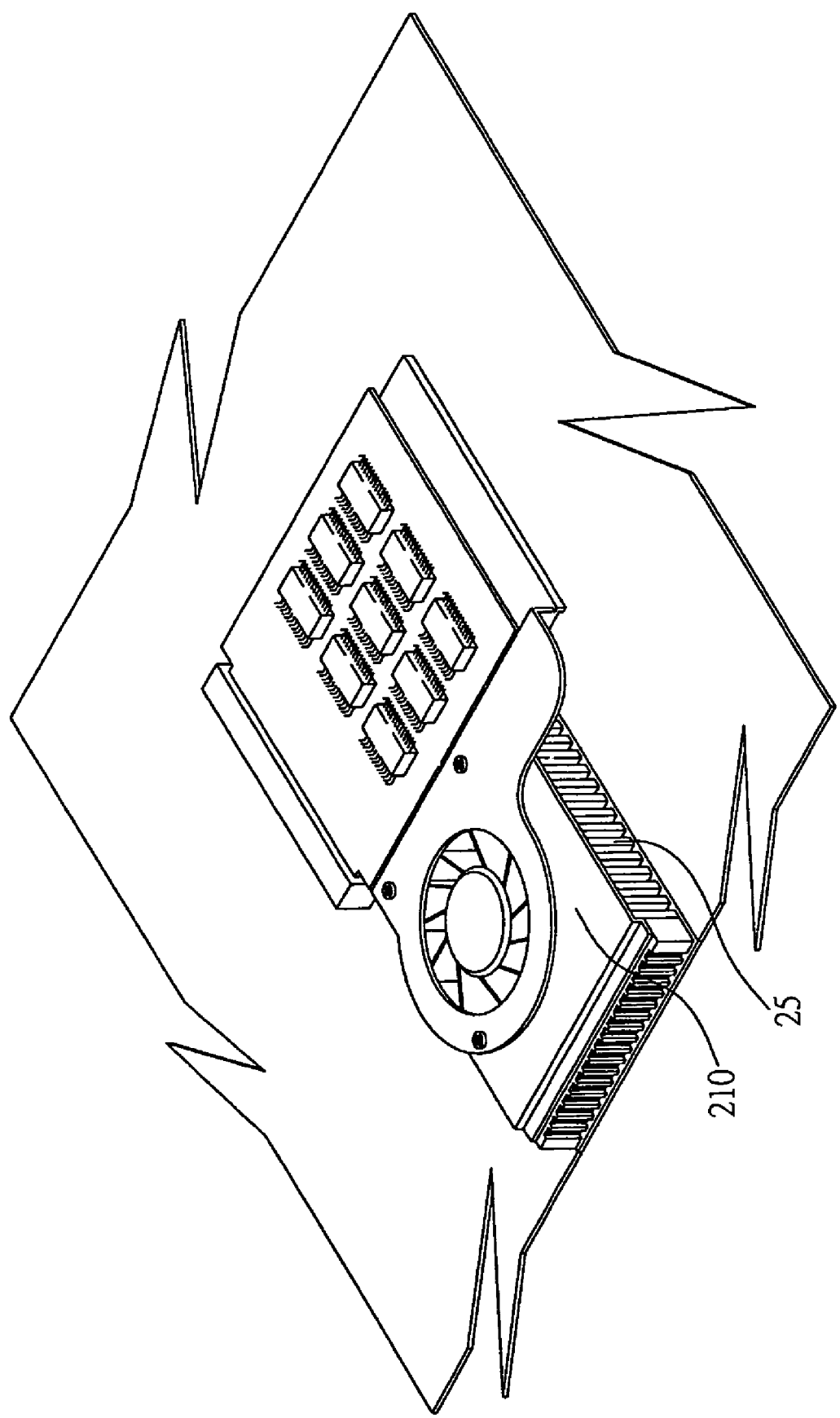
FIG. 2 is a perspective view of a heat dissipating structure for an interface card according to a second preferred embodiment of the present invention.

FIG. 2 is a perspective view of a heat dissipating structure of an interface card fabricated according to a second preferred embodiment of the present invention, which is similar to the heat dissipating structure in the first preferred embodiment. The major distinction between these two embodiments is that a plurality of fins 25 may be further formed around the heat sink 210 in the second embodiment, so as to increase the heat dissipating area and enhance the heat dissipation.

Thus, the heat dissipating structure of the present invention comprises a heat dissipating apparatus mounting on a circuit board of an electronic device, wherein the heat dissipating apparatus includes a heat sink and a fan received in a room that is provided by the heat sink; and an interface card electrically connected to the circuit board of the electronic device via a connector, wherein at least one surface of the interface card on which one or more semiconductor components are mounted is provided on top of the heat dissipating apparatus in a upside-down manner to dissipate the heat generated during operation of the semiconductor components through the heat sink and the fan to an external environment. As the heat sink of the heat dissipating apparatus is made of a metal material with better thermal conductivity, formed with an airfoil extending beneath the interface card without interfering the circuit layout of the electronic device, and turned upside-down such that the surface of the interface card attached with the semiconductor components is provided on top of the airfoil of the heat sink. Moreover, the semiconductor components mounting on the interface card are preferably in contact with the airfoil of the heat sink, so as to immediately dissipate the heat generated by the semiconductor components during operation into the ambient air through the heat sink and the fan arranged therein; and therefore further attachment of the heat dissipating units such as fins to the semiconductor components of the interface card is not required. Accordingly, under the consideration of minimization of the electronic devices within a confined space, the heat generated by the semiconductor components attached to the interface card can be effectively dissipated, and less space and production cost can also be accomplished.

The present invention has been described using exemplary preferred embodiments. However, it is to be understood that the scope of the invention is not limited to the disclosed embodiments. On the contrary, it is intended to cover various modifications and similar arrangement. The scope of claims, therefore, should be accorded the broadest interpretation so as to encompass all such modifications and similar arrangements.

What is claimed is:

1. A heat dissipating structure of an interface card applicable in an electronic device, comprising:
   a heat dissipating apparatus mounting on a circuit board of the electronic device comprising a heat sink and a fan, the heat sink providing a room for receiving the fan and an extending airfoil; and
   an interface card electrically connected and mounted on the circuit board of the electronic device via a connector, wherein at least one surface of the interface card that is mounted with at least one semiconductor component is provided on top of at least a part of the heat dissipating apparatus in a faced-down manner, the at least one semiconductor component being in contact with the extending airfoil of the heat sink so as to dissipate heat generated during operations of the at least one semiconductor component to an external environment through the heat sink and the fan.

2. The heat dissipating structure of claim 1, wherein the heat dissipating apparatus is mounted on a location of the circuit board of the electronic device that leaves the layout of electronic components unaffected.

3. The heat dissipating structure of claim 1, wherein the fan comprises a plurality of blades driven by electrical power so as to generate convection airflow and accelerate the heat dissipation.

4. The heat dissipating structure of claim 1, wherein the heat sink is a bulk structure forming a space for receiving the fan therein.

5. The heat dissipating structure of claim 1, wherein the heat sink has an air outlet connected to the room for expelling the convective airflow generated by the fan from the outlet.

6. The heat dissipating structure of claim 1, wherein the material of the heat dissipating apparatus is an aluminum alloy.

7. The heat dissipating structure of claim 1, wherein the electronic device is a personal computer.

8. The heat dissipating structure of claim 1, wherein a plurality of heat dissipating fins are formed at the periphery of the heat dissipating apparatus so as to increase the heat dissipating area and accelerate the heat dissipation.

9. The heat dissipating structure of claim 1, wherein the at least one semiconductor component is an active component.

10. The heat dissipating structure of claim 1, wherein the at least one semiconductor component is a passive component.

11. The heat dissipating structure of claim 1, wherein the extending airfoil is located between the semiconductor component and the circuit board.

* * * * *